(12) United States Patent
O'Toole et al.

(10) Patent No.: US 6,249,185 B1
(45) Date of Patent: *Jun. 19, 2001

(54) METHOD OF SPEEDING POWER-UP OF AN AMPLIFIER, AND AMPLIFIER

(75) Inventors: James E. O'Toole; John R. Tuttle; Mark E. Tuttle; Tyler Lowrey; Kevin M. Devereaux; George E. Pax; Brian P. Higgins, all of Boise; David K. Ovard, Meridian; Shu-Sun Yu, Boise, all of ID (US); Robert R. Rotzoll, Chipita Park, CO (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/152,662

(22) Filed: Sep. 14, 1998

Related U.S. Application Data

(62) Division of application No. 08/705,043, filed on Aug. 29, 1996, now Pat. No. 6,130,602.
(60) Provisional application No. 60/017,900, filed on May 13, 1996.

(51) Int. Cl.[7] ................................................ H03F 3/45
(52) U.S. Cl. ......................................................... 330/261
(58) Field of Search .............................. 330/69, 252, 253, 330/261, 302, 303, 9, 141, 281; 327/555, 559, 563

(56) References Cited

U.S. PATENT DOCUMENTS

| | | | |
|---|---|---|---|
| 3,299,424 | 1/1967 | Vinding | 340/825.34 |
| 3,852,755 | 12/1974 | Works et al. | 343/701 |
| 4,075,632 | 2/1978 | Baldwin et al. | 342/51 |
| 4,572,976 | 2/1986 | Fockens | 307/524 |
| 4,656,463 | 4/1987 | Anders et al. | 340/572 |

(List continued on next page.)

OTHER PUBLICATIONS

"CMOS Analog Integrated Circuits Based on Weak Inversion Operation", by Eric Vittoz and Jean Fellrath, IEEE Journal of Solid State Circuits, vol. SC–12, No. 3, Jun. 1977.

Mitsubishi Motors Corporation Web Page, 1995.

"Digital RF/ID Enhances GPS", by John R. Tuttle, Proceedings of the Second Annual Wireless Symposium, pp. 406–411, Feb. 15–18, 1994, Santa Clara, CA.

(List continued on next page.)

Primary Examiner—Steven J. Mottola
(74) Attorney, Agent, or Firm—Wells, St. John, Roberts, Gregory & Matkin, P.S.

(57) ABSTRACT

An amplifier powered by a selectively engageable voltage source and a method for operating the amplifier. The amplifier includes first and second electrodes for receiving an input signal to be amplified. The first and second electrodes are adapted to be respectively connected to coupling capacitors. The amplifier also includes a differential amplifier having inputs respectively connected to the first and second electrodes, and having an output. The amplifier additionally includes selectively engageable resistances coupled between the voltage source and respective inputs of the differential amplifier and defining, with the coupling capacitors, the high pass characteristics of the circuit. The amplifier further includes second selectively engageable resistances coupled between the voltage source and respective inputs of the differential amplifier. The second resistances respectively have smaller values than the first mentioned resistances, and are engaged and then disengaged in response to the voltage source being engaged.

9 Claims, 1 Drawing Sheet

Microfiche Appendix Included
(5 Microfiche, 266 Pages)

U.S. PATENT DOCUMENTS

| | | | |
|---|---|---|---|
| 4,700,179 | 10/1987 | Francher | 340/572.2 |
| 4,724,427 | 2/1988 | Carroll | 340/572 |
| 4,743,864 | 5/1988 | Nakagawa et al. | 455/343 X |
| 4,746,830 | 5/1988 | Holland | 310/313 D |
| 4,786,903 | 11/1988 | Grindahl et al. | 340/825.54 |
| 4,800,543 | 1/1989 | Lyndon-James et al. | 368/10 |
| 4,816,839 | 3/1989 | Landt | 343/795 |
| 4,827,395 | 5/1989 | Anders et al. | 364/138 |
| 4,853,705 | 8/1989 | Landt | 343/803 |
| 4,854,328 | 8/1989 | Pollack | 128/736 |
| 4,857,893 | 8/1989 | Carroll | 340/572 |
| 4,862,160 | 8/1989 | Ekchian et al. | 340/825.54 |
| 4,870,419 | 9/1989 | Baldwin et al. | 342/50 |
| 4,888,591 | 12/1989 | Landt et al. | 342/44 |
| 4,890,072 | 12/1989 | Espe et al. | 331/11 |
| 4,912,471 | 3/1990 | Tyburski et al. | 342/42 |
| 4,926,182 | 5/1990 | Ohta et al. | 342/44 |
| 4,952,889 | 8/1990 | Irwin et al. | 332/128 |
| 5,030,807 | 7/1991 | Landt et al. | 235/375 |
| 5,075,691 | 12/1991 | Garay et al. | 343/830 |
| 5,086,389 | 2/1992 | Hassett et al. | 364/401 |
| 5,122,687 * | 6/1992 | Schmidt | 327/52 |
| 5,128,938 | 7/1992 | Borras | 455/343 X |
| 5,130,668 * | 7/1992 | Emslie et al. | 330/281 |
| 5,134,085 | 7/1992 | Gilgen et al. | 437/52 |
| 5,142,292 | 8/1992 | Chang | 343/742 |
| 5,144,314 | 9/1992 | Malmberg et al. | 342/44 |
| 5,151,624 * | 9/1992 | Stegherr et al. | 327/356 |
| 5,164,985 | 11/1992 | Nysen et al. | 380/9 |
| 5,175,774 | 12/1992 | Traux et al. | 382/8 |
| 5,191,295 | 3/1993 | Necoechea | 328/155 |
| 5,206,609 | 4/1993 | Mijuskovic | 331/57 |
| 5,218,343 | 6/1993 | Stobbe et al. | 340/572 |
| 5,252,979 | 10/1993 | Nysen | 342/50 |
| 5,272,367 | 12/1993 | Dennison et al. | 257/306 |
| 5,281,927 | 1/1994 | Parker | 331/1 A |
| 5,287,112 | 2/1994 | Schuermann | 342/42 |
| 5,294,928 | 3/1994 | Cooper et al. | 341/142 |
| 5,300,875 | 4/1994 | Tuttle | 320/20 |
| 5,323,150 | 6/1994 | Tuttle | 340/825.54 |
| 5,355,513 | 10/1994 | Clarke et al. | 455/20 |
| 5,365,551 | 11/1994 | Snodgrass et al. | 375/1 |
| 5,374,930 | 12/1994 | Schuermann | 342/42 |
| 5,394,444 | 2/1995 | Silvey et al. | 327/156 |
| 5,406,263 | 4/1995 | Tuttle | 340/572 |
| 5,412,665 | 5/1995 | Gruodis et al. | 371/27 |
| 5,416,434 | 5/1995 | Koostra et al. | 327/113 |
| 5,420,757 | 5/1995 | Eberhardt et al. | 361/813 |
| 5,430,441 | 7/1995 | Bickley et al. | 340/825.54 |
| 5,444,223 | 8/1995 | Blama | 235/435 |
| 5,448,110 | 9/1995 | Tuttle et al. | 257/723 |
| 5,448,242 | 9/1995 | Sharpe et al. | 342/42 |
| 5,450,087 | 9/1995 | Hurta et al. | 342/42 |
| 5,461,385 | 10/1995 | Armstrong | 342/42 |
| 5,471,212 | 11/1995 | Sharpe et al. | 342/51 |
| 5,478,991 | 12/1995 | Watanabe et al. | 235/375 |
| 5,489,546 | 2/1996 | Ahmad et al. | 437/57 |
| 5,499,214 | 3/1996 | Mori et al. | 365/222 |
| 5,500,650 | 3/1996 | Snodgrass et al. | 342/42 |
| 5,525,992 | 6/1996 | Froschermeier | 342/42 |
| 5,541,583 | 7/1996 | Mandelbaum | 340/825.54 |
| 5,541,585 | 7/1996 | Duhame et al. | 340/825.69 |
| 5,568,512 | 10/1996 | Rotzoll | 375/211 |
| 5,576,647 | 11/1996 | Sutardja et al. | 327/108 |
| 5,606,323 | 2/1997 | Heinrich et al. | 342/51 |
| 5,621,412 | 4/1997 | Sharpe et al. | 342/51 |
| 5,623,224 | 4/1997 | Yamada et al. | 327/333 |
| 5,649,296 | 7/1997 | MacLellan et al. | 455/38.2 |
| 5,657,359 | 8/1997 | Sakae et al. | 327/157 |
| 5,677,667 | 10/1997 | Leseky et al. | 340/431 |
| 5,686,864 | 11/1997 | Martin et al. | 327/159 |
| 5,686,920 | 11/1997 | Hurta et al. | 342/42 |
| 5,719,550 | 2/1998 | Bloch et al. | 340/426 |
| 5,721,678 | 2/1998 | Widl | 705/417 |
| 5,721,783 | 2/1998 | Anderson | 381/68.6 |
| 5,726,630 | 3/1998 | Marsh et al. | 340/572.4 |
| 5,774,022 | 6/1998 | Griffin et al. | 331/1 A |
| 5,815,042 | 9/1998 | Chow et al. | 331/57 |
| 6,130,602 | 10/2000 | O'Toole et al. | 340/825.54 |

OTHER PUBLICATIONS

"*Micron Morning Report*", The Idaho Statesman, Jul. 16, 1993.

"*A Low–Power Spread Spectrum CMOS RFIC for Radio Identification Applications*", by John R. Tuttle, Conference Proceedings from RF Expo West, pp. 216–222, Mar. 22–24, 1994, San Jose, CA.

Provisional Application, Serial No. 60/023,321, Filed Jul. 30, 1996.

Provisional Application, Serial No. 60/023,318, Filed Jul. 30, 1996.

"Micron RFID Communications Protocol Manual," Jul. 22, 1993, Pre–Release Version 0.95, pp. 1–71.

Designing Detectors for RF/ID Tags, Raymond Waugh, RF Expo West Conference, pp. 1–12, Jan. 29–Feb. 1, 1995.

*Analysis and Design of Analog Integrated Circuits*, Paul R. Gray & Robert G. Meyer, pp. 667–681, 1993.

*Analog Integrated Circuits for Comunication* (Principles, Stimulation and Design), Donald O. Pederson & Kartikeya Mayaram, pp. 431–433, 1991.

A Precise Four–Quadrant Multiplier With Subnanosecond Response, B. Gilbert, IEEE Journal of Solid State Circuits, pp. 365–373, 1968.

* cited by examiner

METHOD OF SPEEDING POWER-UP OF AN AMPLIFIER, AND AMPLIFIER

CROSS-REFERENCE TO RELATED APPLICATION

This is a division of, and additional disclosure is provided in, U.S. patent application Ser. No. 08/705,043, filed Aug. 29, 1996, now U.S. Pat. No. 6,130,602, issued on Oct. 10, 2000, which patent is hereby incorporated herein by reference, which in turn claims priority from U.S. Provisional Application Serial No. 60/017,900, filed May 13, 1996.

COPYRIGHT AUTHORIZATION

A portion of the disclosure of this patent document, including the appended microfiche, contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

REFERENCE TO MICROFICHE

Appended hereto is a microfiche copy of a software guide entitled "Micron RFID Systems Developer's Guide," May 2, 1996. This appendix has 5 microfiche providing 266 total frames.

TECHNICAL FIELD

This invention relates to radio frequency communication devices. More particularly, the invention relates to radio frequency identification devices for inventory control, object monitoring, or for determining the existence, location or movement of objects.

BACKGROUND OF THE INVENTION

As large numbers of objects are moved in inventory, product manufacturing, and merchandising operations, there is a continuous challenge to accurately monitor the location and flow of objects. Additionally, there is a continuing goal to interrogate the location of objects in an inexpensive and streamlined manner. Furthermore, there is a need for tag devices suitably configured to mount to a variety of objects including goods, items, persons, or animals, or substantially any moving or stationary and animate or inanimate object. One way of tracking objects is with an electronic identification system.

One presently available electronic identification system utilizes a magnetic field modulation system to monitor tag devices. An interrogator creates a magnetic field that becomes detuned when the tag device is passed through the magnetic field. In some cases, the tag device may be provided with a unique identification code in order to distinguish between a number of different tags. Typically, the tag devices are entirely passive (have no power supply), which results in a small and portable package. However, this identification system is only capable of distinguishing a limited number of tag devices, over a relatively short range, limited by the size of a magnetic field used to supply power to the tags and to communicate with the tags.

Another electronic identification system utilizes an RF transponder device affixed to an object to be monitored, in which an interrogator transmits an interrogation signal to the device. The device receives the signal, then generates and transmits a responsive signal. The interrogation signal and the responsive signal are typically radio-frequency (RF) signals produced by an RF transmitter circuit. Since RF signals can be transmitted over greater distances than magnetic fields, RF-based transponder devices tend to be more suitable for applications requiring tracking of a tagged device that may not be in close proximity to an interrogator. For example, RF-based transponder devices tend to be more suitable for inventory control or tracking.

SUMMARY OF THE INVENTION

In accordance with an aspect of the present invention, an amplifier powered by a selectively engageable voltage source is disclosed. The amplifier includes first and second electrodes for receiving an input signal to be amplified. The first and second electrodes are adapted to be respectively connected to coupling capacitors. The amplifier also includes a differential amplifier having inputs respectively connected to the first and second electrodes, and having an output. The amplifier additionally includes selectively engageable resistances coupled between the voltage source and respective inputs of the differential amplifier and defining, with the coupling capacitors, the high pass characteristics of the circuit. The amplifier further includes second selectively engageable resistances coupled between the voltage source and respective inputs of the differential amplifier. The second resistances respectively have smaller values than the first mentioned resistances, and are engaged and then disengaged in response to the voltage source being engaged.

In another aspect, the present invention includes a method of speeding power up of an amplifier stage powered by a voltage source. The amplifier includes first and second electrodes for receiving an input signal to be amplified. The input electrodes are adapted to be respectively connected to coupling capacitors. The amplifier also includes a differential amplifier having inputs respectively connected to the first and second electrodes, and having an output. The amplifier further includes selectively engageable resistances coupled between the voltage source and respective inputs of the differential amplifier. The method includes shorting around the selectively engageable resistances for a predetermined amount of time in response to the voltage source being engaged.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
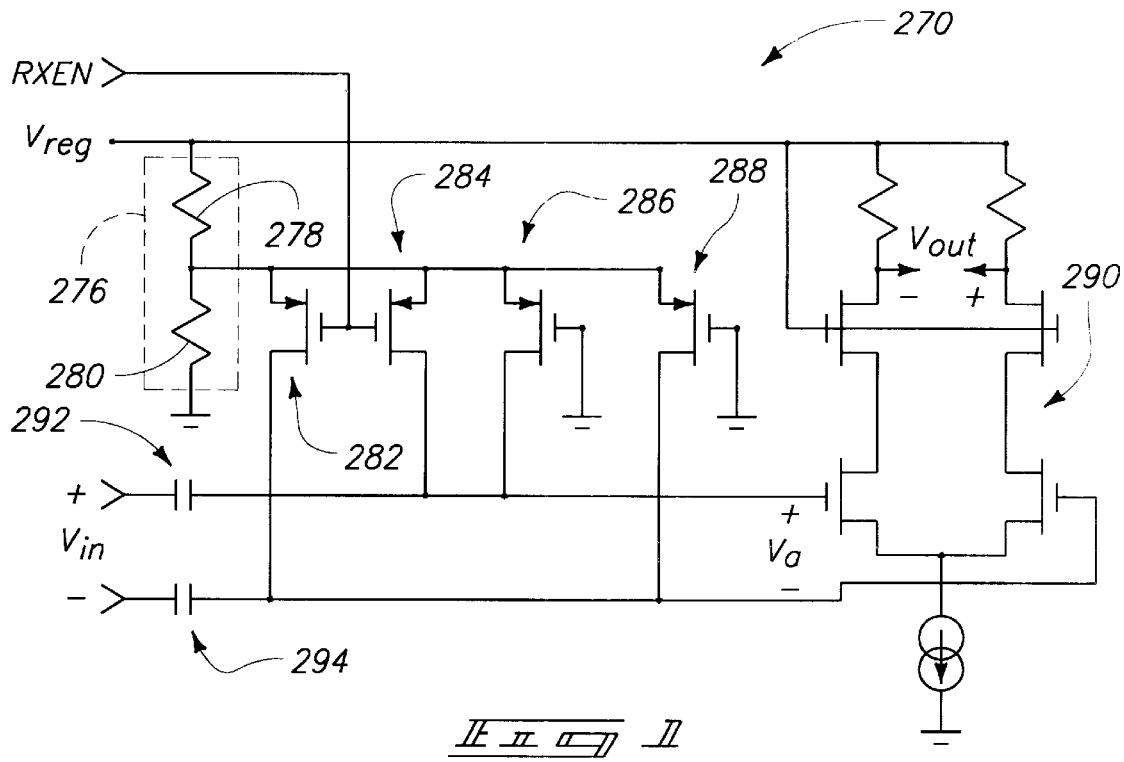
FIG. 1 is a simplified circuit schematic of a quick bias AC-coupled video amplifier included in the integrated circuit.

FIG. 1 provides a simplified circuit schematic of a quick bias AC-coupled video amplifier 270. The video amplifier goes from a power down (unbiased) state to a fully biased state quickly despite a large value effective resistance and capacitor used to bias and couple the amplifier.

The video amplifier 270 has an input adapted to be connected to $V_{in}$ and includes coupling capacitors 292 and 294 at the input.

Figure 2:
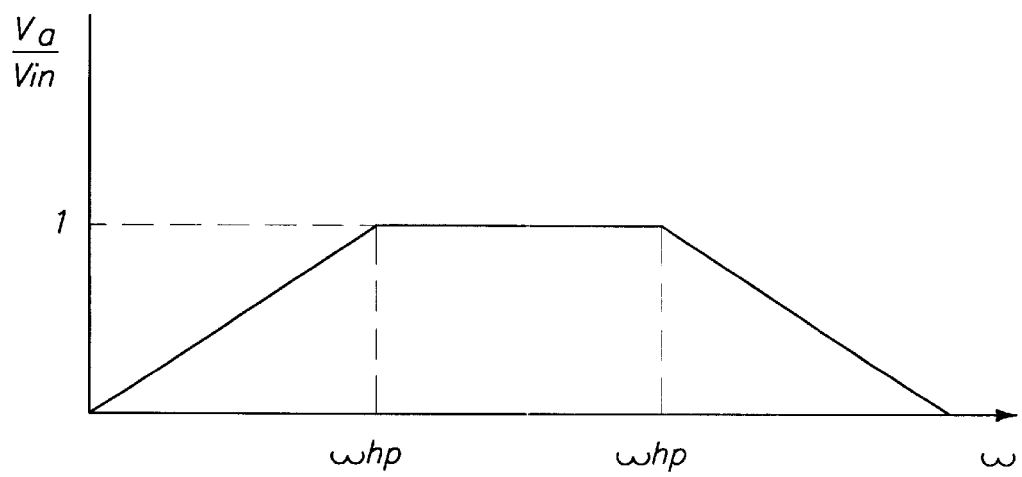
FIG. 2 is a plot of voltage versus angular frequency illustrating selection of components to realize a desired high pass roll off frequency in the amplifier of FIG. 1.

The video amplifier includes a voltage divider 276 including two resistors 278 and 280 in series, and four transistors 282, 284, 286, and 288 shown to the right of a voltage divider in FIG. 4B. Transistors 286 and 288, the rightmost two of the four transistors, are long L (length), narrow W (width) p-channel devices operated in linear mode to provide very high effective resistance $R_{EFF}$. Transistors 286 and 288 are used instead of resistors because it is hard to provide high resistances using resistors without generating undesirable parasitic capacitance and without taking up more space on an integrated circuit die. The video amplifier 270 includes a differential amplifier 290. The voltage divider 276 sets a bias voltage at the inputs of the differential amplifier 290. The effective resistance $R_{EFF}$, in conjunction with the value of coupling capacitor 292 or 294, sets the angular high pass roll off frequency for the amplifier according to a relationship of $\omega_{HP}=1/((R_{EFF}+R1\|R2)C1)$ where $\omega$ is angular frequency ($2\pi$ times frequency), R1 and R2 are the values of the resistors 278 and 280 included in the voltage divider 276, and C1 is the value of one of the coupling capacitors. The values of $R_{EFF}$, and the coupling capacitors are adjusted to achieve the desired high pass roll off frequency $\omega_{HP}$ as illustrated in FIG. 2. The high pass roll off frequency determines what frequencies will be amplified or attenuated. The high pass roll off frequency is set low enough so that important data is not excluded.

In many applications, the values of these components are high. For example, in the integrated circuit 16, $R_{EFF}$ is approximately two MegaOhms, and the capacitance of each of the coupling capacitors 292 and 294 is approximately one picoFarad, which gives an angular high pass frequency of approximately $1/((2\text{MegaOhms})(1\text{pF}))=500$ kiloradians/second, or a high pass frequency of $500/2\pi=79.6$ kHz.

In a powered down state, input Vreg is zero. Upon power up, there is a delay before the inputs reach the desired bias voltage, according to a relationship $V_{BIAS}=R1/(R1+R2)V_{reg}$. The time constant equals $R_{EFF}C1$ which is approximately equal to two microseconds.

If it is decided to wait five time constants, this requires about ten microseconds.

In accordance with the invention, transistors 282 and 284 are added (the two leftmost transistors of the four). These are short L (length) wide W (width) devices which allow the bias voltage to be established in much less time by shorting around the high resistance of the right two transistors 286 and 288. The time constant is thereby reduced. This shorting occurs when an input RXEN is low. Before using the circuit as an amplifier, RXEN is taken high (after bias voltage is achieved). This restores the desired frequency behavior.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An amplifier powered by a selectively engageable voltage source, the amplifier comprising:

first and second electrodes for receiving an input signal to be amplified, the input first and second electrodes being adapted to be respectively connected to coupling capacitors;

a differential amplifier having inputs respectively connected to the first and second electrodes, and having an output;

selectively engageable resistances between the voltage source and respective inputs of the differential amplifier and defining, with the coupling capacitors, the high pass characteristics of the circuit; and second selectively engageable resistances between the voltage source and respective inputs of the differential amplifier, the second resistances respectively having smaller values than the first mentioned resistances, the second resistances being engaged then disengaged in response to the voltage source being engaged.

2. An amplifier in accordance with claim 1 and further comprising coupling capacitors respectively connected to the first and second electrodes.

3. An amplifier in accordance with claim 1 and further comprising a voltage divider, and wherein the first mentioned and second resistances are connected to the voltage source via the voltage divider.

4. An amplifier in accordance with claim 1 wherein the first mentioned resistances comprise respective transistors.

5. An amplifier in accordance with claim 1 wherein the first mentioned resistances comprise respective p-type transistors.

6. An amplifier in accordance with claim 1 wherein the second resistances comprise respective transistors.

7. An amplifier in accordance with claim 1 wherein the second resistances comprise respective p-type transistors.

8. A method of speeding power up of an amplifier stage powered by a voltage source and including first and second electrodes for receiving an input signal to be amplified, the input electrodes being adapted to be respectively connected to coupling capacitors; a differential amplifier having inputs respectively connected to the first and second electrodes, and having an output; and selectively engageable resistances between the voltage source and respective inputs of the differential amplifier, the method comprising:

shorting around the selectively engageable resistances for a predetermined amount of time in response to the voltage source being engaged.

9. A method in accordance with claim 8 wherein the shorting step comprises engaging selectively engageable second resistances respectively connected in parallel with the first mentioned resistances and having respective resistance values lower than the first mentioned resistances.

* * * * *

UNITED STATES PATENT AND TRADEMARK OFFICE
CERTIFICATE OF CORRECTION

PATENT NO. : 6,249,185 B1  
DATED : June 19, 2001  
INVENTOR(S) : James E. O'Toole et al.

Page 1 of 1

It is certified that error appears in the above-identified patent and that said Letters Patent is hereby corrected as shown below:

<u>Column 4,</u>  
Line 7, replace "the input first and second" with -- the first and second --.

Signed and Sealed this

Fifteenth Day of January, 2002

*Attest:*

JAMES E. ROGAN  
*Attesting Officer*     *Director of the United States Patent and Trademark Office*